United States Patent [19]

Ott

[11] 4,062,042
[45] Dec. 6, 1977

[54] D.C. CONTROLLED ATTENUATOR

[75] Inventor: Arthur Richard Ott, Kitchener, Canada

[73] Assignee: Electrohome Limited, Kitchener, Canada

[21] Appl. No.: 730,620

[22] Filed: Oct. 7, 1976

[51] Int. Cl.$^2$ .................. H04N 9/537; H03F 3/18; H03G 3/10
[52] U.S. Cl. .................. 358/27; 307/251; 307/255; 307/264; 307/313; 323/23; 330/284; 358/40
[58] Field of Search .................. 358/21, 27, 29, 30, 358/35, 40; 307/264, 251, 255, 288, 313; 330/13, 29, 30 R, 129–131, 124 R; 323/19, 22 T, 23

[56] References Cited

U.S. PATENT DOCUMENTS

| 3,914,702 | 10/1975 | Gehweiler | 330/13 |
| 3,919,712 | 11/1975 | Izumisawa et al. | 358/40 X |

Primary Examiner—Robert L. Richardson
Attorney, Agent, or Firm—Sim & McBurney

[57] ABSTRACT

A D.C. controlled attenuator which is particularly useful as a D.C. controlled video attenuation circuit providing three tracking channels that can be used as a tracking contrast control in an RGB monitor includes an integrated circuit having at least six MOS field effect transistors on a common substrate, the transistors being of N-channel and P-channel type and being arranged in the three groups of two each connected in complementary symmetry. In each group the gate electrodes of the N-channel and P-channel transistors are connected together, their drain electrodes are connected together and a source of D.C. potential is connected between their source electrodes in parallel. A variable resistor is connected between the gate electrodes of the transistors of a group and the drain electrodes of those transistors providing a feed forward signal path that also preferably includes a variable inductance coil. Input signals are supplied to the gate electrodes of the transistors, and the magnitude of the D.C. potential of the source of D.C. potential can be varied. By adjusting the value of the resistor in the feed forward signal path, cancellation of the signal at the drain junction of the COS MOS amplifier can be achieved at maximum gain of the amplifier, so that when the gain of the amplifier is reduced, less attenuation results.

9 Claims, 1 Drawing Figure

D.C. CONTROLLED ATTENUATOR

BACKGROUND OF THE INVENTION

This invention relates to a D.C. controlled attenuator. More specifically, this invention relates to a D.C. controlled video attenuation circuit (contrast control) with three tracking channels that may be used, for example, as a tracking contrast control in an RGB video monitor.

Several systems have been developed for use in controlling contrast in high quality television monitors. One system, which involves the use of complex circuitry, involves adding and monitoring a flag on the back porch of the horizontal sync pulse. Another system, which is bulky and expensive, uses three banks of resistors controlled by a multi-position three ganged switch.

SUMMARY OF THE INVENTION

In accordance with this invention there is provided a D.C. controlled attenuator comprising an integrated circuit including at least four MOS field effect transistors on a common substrate, said transistors including at least first and second n-channel and at least first and second p-channel transistors each having drain, source and gate electrodes, said first n-channel and p-channel transistors being connected in complementary symmetry with said gate electrodes thereof being connected together and a source of D.C. potential connected between said source electrodes thereof, said second n-channel and p-channel transistors being connected in complementary symmetry with said gate electrodes thereof being connected together, said drain electrodes thereof being connected together and said source of D.C. potential being connected between said source electrodes thereof, a first variable resistor connected between said gate electrodes of said first transistors and said drain electrodes of said first transistors providing a first feed forward signal path, a second variable resistor connected between said gate electrodes of said second transistors and said drain electrodes of said second transistors providing a second feed forward signal path, means for supplying a first input signal to said gate electrodes of said first transistors, means for supplying a second input signal to said electrodes of said second transistors, and means for varying the magnitude of the D.C. potential of said source of D.C. potential.

BRIEF DESCRIPTION OF THE DRAWINGS

This invention will be more apparent from the following detailed description, taken in conjunction with the appended drawing which is a circuit diagram showing a D.C. controlled attenuator embodying this invention.

DETAILED DESCRIPTION OF THE INVENTION INCLUDING THE PREFERRED EMBODIMENT

Figure 1:
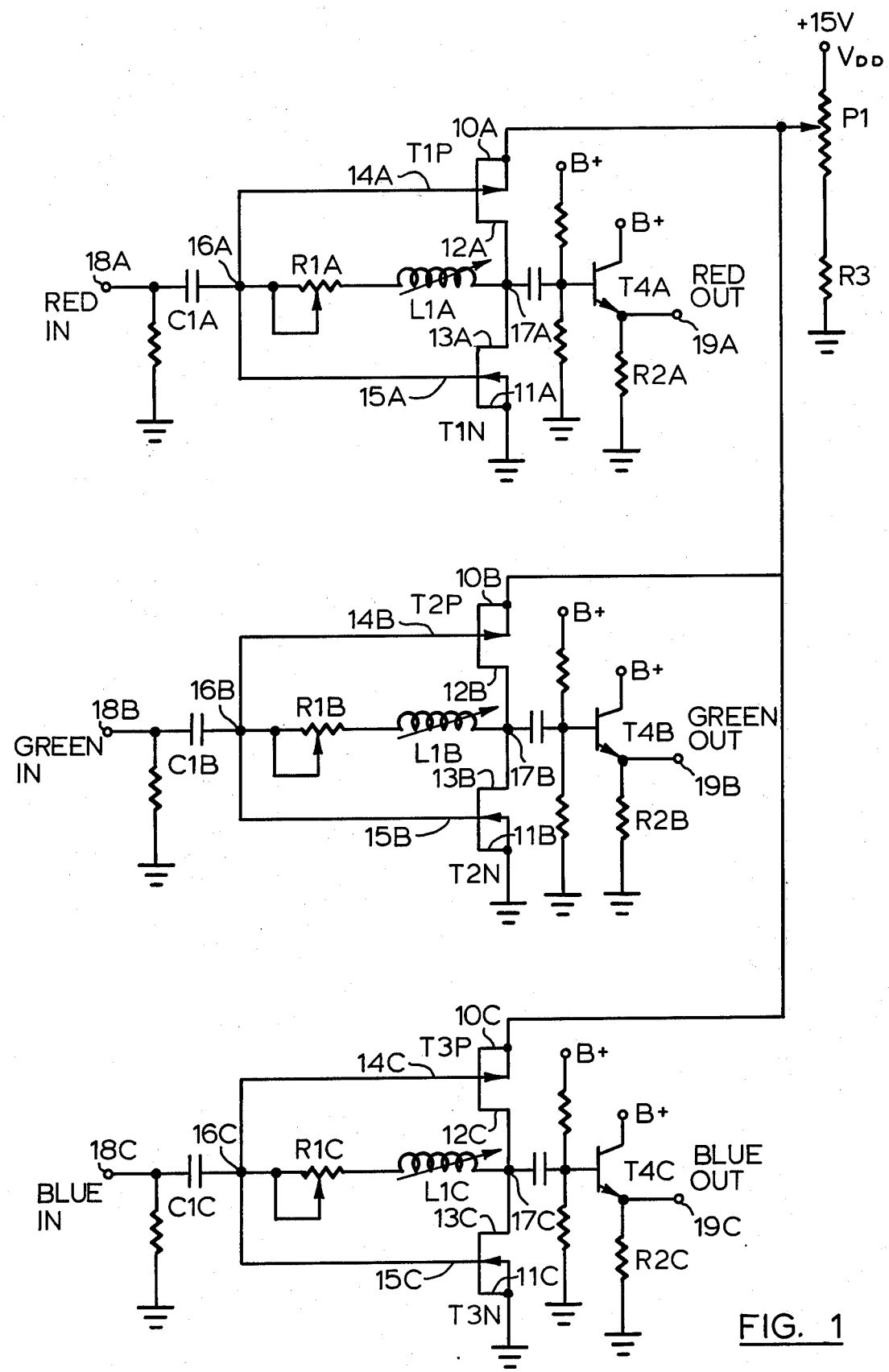

Referring to the drawing, there is shown a plurality of MOS field effect transitors comprising three n-channel and three p-channel enhancement type MOS transistors. These transistors are arranged in complementary symmetry and thus are grouped into three groups, each group including an n-channel and a p-channel transistor. The former are designated T1N, T2N and T3N respectively, while the latter are designated T1P, T2P, and T3P respectively. Each of the three groups is identical, so only one group will be described in detail. Corresponding components in the other two groups will be labelled with the same reference letters any/or numerals as the first group but will employ the final letters B & C rather than A.

Referring to the first group, transistors T1P and T1N have source electrodes 10A and 11A, drain electrodes 12A and 13A and gate electrodes 14A and 15A. Transistors T1P and T1N are connected in complementary symmetry as a linear amplifier with their gate electrodes connected to a common terminal 16A, their drain electrodes connected to a common terminal 17A, source 10A connected to a source of positive D.C. voltage and source 11A grounded.

Connected between terminals 16A and 17A is what could be referred to as a feed forward network consisting of a variable resistor R1A and a variable inductance coil L1A.

The input terminal of the network being described is designated 18A and is connected to terminal 16A via a capacitor C1A.

The output terminal of the network is designated 19A and is connected to the emitter of a bipolar transistors T4A that is connected in emitter follower configuration with its base electrode being connected to a blocking capacitor that is connected between terminal 17A and the base of electrode of transistor T4A, its collector electrode being connected to a suitable source of positive D.C. potential, B+, and its emitter electrode being connected via a resistor R2A to ground.

In order to provide the required degree of tracking, transistor T1P, T2P, T3P, T1N, T2N, and T3N should be constituted by an integrated circuit, whereby these transistors are on a common substrate. As a result, changes in temperature will affect all of the transistors to the same extent, so, once the attenuators are aligned, alignment will be maintained, regardless of temperature changes. Similarly, gain reduction of the three attenuators, once aligned, will be maintained because all of the MOS field effect transistors are uniformly constructed. It should be appreciated, of course, that if only two input signals are required to be processed, one of the attenuators can be eliminated. On the other hand, if more than three input signals are to be processed, additional attenuators will have to be provided.

In accordance with the preferred embodiment of this invention an RCA (Trade Mark) CA 3600E integrated circuit is employed in the practice of this invention.

As shown in the drawing, the sources 10A, 10B and 10C of transistors T1P, T2P and T3P all are connected to the same source of positive D.C. potential designated VDD. In the embodiment shown VDD is +15 volts and is connected across a voltage divider consisting of a potentiometer P1 and a resistor R3. The voltage supplied to the source electrodes of transistors T1P, T2P and T3P is varied simultaneously and identically by varying the position of the slider of potentiometer P1. All of the sources of transistors T1N, T2N and T3N are connected to a common ground terminal, which is the negative terminal of VDD power supply.

In accordance with the instant invention, each complementary symmetry amplifier is modified to become an attenuator by the addition of a feed forward network and the alignment thereof. In the preferred embodiment of the invention each feed forward network is constituted by a variable resistor and a variable inductance coil such as R1A and L1A. Depending on the results which are required and the practical application, the coil, which compensates for high frequencies, may be eliminated.

Variable resistors R1A, R1B and R1C are chosen so that with their respective amplifiers at maximum gain, this being determined by the setting of the slider of potentiometer P1, the overall gain of each amplifier must be capable of being reduced to unity. This is achieved by the signal fed forward through resistor R1A, for example, being equal and opposite to the signal of the COS MOS amplifier. When this condition obtains, as the attenuation control P1 is turned down or made less positive, the overall gain of the system reduces to less than unity and less attenuation results. Resistors R1A, R1B, and R1C usually will be about 470 ohms.

The alignment procedure is identical for each group and thus will be described only for the first group.

A composite video multiburst signal is applied to input terminal 18A. This signal may be up to 10MH$_z$ at 1 volt p.p. The attenuation control potentiometer P1, is adjusted for maximum gain by setting the control at +15 volts. The output signal at terminal 19A is monitored using an oscilloscope. Resistor R1A then is adjusted for maximum attenuation (null) of the low frequencies. The attenuation control is adjusted for a 30 db attenuation of the input signal. Finally coil L1A is adjusted for a flat frequency response to 10MH$_z$. The attenuator now will have a flat, linear response between 30 and 1000 millivolts p.p. for a VDD change of 3 volts to about 14 volts. As indicated beforehand, the operation of the circuit is such that at maximum VDD the inverted output of the COS MOS amplifier is cancelled by the antiphase input signal fed forward through the R-L network resulting in unity gain, this being reduced to below unity at lower settings of VDD.

It will be appreciated, of course, that once all of the groups have been aligned by the foregoing procedure, and because all of the MOS transistors are on the same substrate, any change in the setting of the slider of potentiometer P1 will affect each group identically, so that the red, green and blue input signals which are supplied to input terminals 18A, 18B and 18C respectively will be identically attenuated, as is required in a tracking contrast control. It also should be noted that this result is achieved without, as is required in some prior art contrast control system, running multi-coaxial cables to the front panel of the monitor. Such cables cause frequency roll-off and matching problems. In the present case potentiometer P1 is a simple D.C. operator control that can be readily located at the front of the monitor without problems of the foregoing type.

While a preferred embodiment of the invention as disclosed herein in detail, those skilled in the art will appreciate that changes and modifications may be made therein without departing from the spirit and scope of the invention as defined in the appended claims.

What is claimed is:

1. A D.C. controlled attenuator comprising an integrated circuit including at least four MOS field effect transistors on a common substrate, said transistors including at least first and second n-channel and at least first and second p-channels transistors each having drain, source and gate electrodes, said first n-channel and p-channel transistors being connected in complementary symmetry with said gate electrodes thereof being connected together, said drain electrodes thereof being connected together and a source of D.C. potential connected between said source electrodes thereof, said n-channel and p-channel transistors being connected in complementary symmetry with said gate electrodes thereof being connected together, said drain electrodes thereof being connected together, and said source of D.C. potential being connected between said source electrodes thereof, a first variable resistor connected between said gate electrodes of said first transistors and said drain electrodes of said first transistors providing a first feed signal path, a second variable resistor connected between said gate electrodes of said second transistors and said drain electrodes of said second transistors providing a second feed forward signal path, means for supplying a first input signal to said gate electrodes of said first transistors, means for supplying a second input signal to said gate electrodes of said second transistors, and means for varying the magnitude of the D.C. potential of said source of D.C. potential.

2. A D.C. controlled attenuator according to claim 1 wherein said first feed forward signal path includes a first variable reactance device and said second feed forward signal path includes a second variable reactance device.

3. A D.C. controlled attenuator according to claim 2 wherein said variable reactance devices are variable inductance coils.

4. A D.C. controlled attentuator according to claim 1 wherein there are third n-channel and p-channel MOS field effect transistors on said common substrate, said third transistors each having drain, source and gate electrodes, said third n-channel and p-channel transistors being connected in complementary symmetry with said gate electrodes thereof being connected together, said drain electrodes thereof being connected together and said source of D.C. potential being connected between said source electrodes thereof, a third variable resistor connected between said gate third variable resistor connected between said gate electrodes of said third transistors and said drain electrodes of said third transistors providing a third feed forward signal path and means for supplying a third input signal to said gate electrodes of said third transistors.

5. A D.C. controlled attenuator according to claim 4 wherein said third feed forward signal path includes a third variable reactance device.

6. A D.C. controlled attenuator according to claim 5 wherein said third variable reactance device is a variable inductance coil.

7. An RGB video monitor having a contrast control constituted by a D.C. controlled attenuator according to claim 4, said first to third input signals being R, G, & B signals respectively.

8. An RGB video monitor according to claim 7 wherein said third feed forward signal path includes a third variable reactance device.

9. An RGB video monitor according to claim 8 wherein said third variable reactance device is a variable inductance coil.

* * * * *